(12) United States Patent
DeJule

(10) Patent No.: US 9,989,993 B2
(45) Date of Patent: Jun. 5, 2018

(54) MONITOR ASSEMBLY

(71) Applicant: Aaron DeJule, River Forest, IL (US)

(72) Inventor: Aaron DeJule, River Forest, IL (US)

(*) Notice: Subject to any disclaimer, the term of this patent is extended or adjusted under 35 U.S.C. 154(b) by 0 days. days.

(21) Appl. No.: 15/630,480

(22) Filed: Jun. 22, 2017

(65) Prior Publication Data

US 2017/0371370 A1 Dec. 28, 2017

Related U.S. Application Data

(60) Provisional application No. 62/354,428, filed on Jun. 24, 2016.

(51) Int. Cl.
| | |
|---|---|
| *G06F 1/16* | (2006.01) |
| *H05K 5/00* | (2006.01) |
| *H05K 7/00* | (2006.01) |
| *H01L 51/00* | (2006.01) |
| *H01L 51/52* | (2006.01) |

(52) U.S. Cl.
CPC ........ *G06F 1/1616* (2013.01); *H01L 51/0097* (2013.01); *H01L 51/5237* (2013.01); *H01L 2251/5338* (2013.01)

(58) Field of Classification Search
CPC .... G06F 1/1613; G06F 1/1615; G06F 1/1616; G06F 1/162; H01L 51/0097; H01L 51/5237
USPC .............. 361/679.21–679.3, 679.55, 679.56
See application file for complete search history.

(56) References Cited

U.S. PATENT DOCUMENTS

| | | | | |
|---|---|---|---|---|
| 6,975,507 | B2* | 12/2005 | Wang .................... | G06F 1/1616 16/333 |
| 8,089,750 | B2* | 1/2012 | Chen .................... | G06F 1/1616 248/278.1 |
| 9,071,675 | B2* | 6/2015 | Willenborg ............ | H04M 1/04 |
| 2004/0203994 | A1* | 10/2004 | Won ........................ | G06F 1/162 455/522 |
| 2006/0187625 | A1* | 8/2006 | Jung ...................... | G06F 1/1601 361/679.06 |
| 2012/0176741 | A1* | 7/2012 | Wu ........................ | G06F 1/1601 361/679.09 |
| 2013/0038996 | A1* | 2/2013 | Griffin ................... | G06F 1/162 361/679.08 |
| 2014/0063714 | A1* | 3/2014 | Chung ................... | G06F 1/162 361/679.09 |
| 2014/0340829 | A1* | 11/2014 | Matsumoto ........... | G06F 1/1616 361/679.27 |
| 2014/0340840 | A1* | 11/2014 | Han ....................... | G06F 1/1632 361/679.43 |

(Continued)

*Primary Examiner* — Anthony Haughton
(74) *Attorney, Agent, or Firm* — Wood, Phillips, Katz, Clark & Mortimer

(57) ABSTRACT

A monitor assembly having an electronic monitor with a frame and a display area and a support assembly configured to act between the monitor frame and a support for the electronic monitor. The support assembly has at least one link member configured to be movable: a) relative to the monitor frame around a first axis with the support assembly in operative relationship with the monitor frame; and b) relative to the support around a second axis with the support assembly in operative relationship with the support. The first and second axes are non-parallel to each other. The electronic monitor is guided in movement relative to the electronic monitor support around the first and second axes to thereby reposition the monitor display area relative to the support.

20 Claims, 8 Drawing Sheets

(56) References Cited

U.S. PATENT DOCUMENTS

2015/0055291 A1\* 2/2015 Chuang ................... G06F 1/162
                                                        361/679.55
2017/0192468 A1\* 7/2017 Park ...................... G06F 1/1681

\* cited by examiner

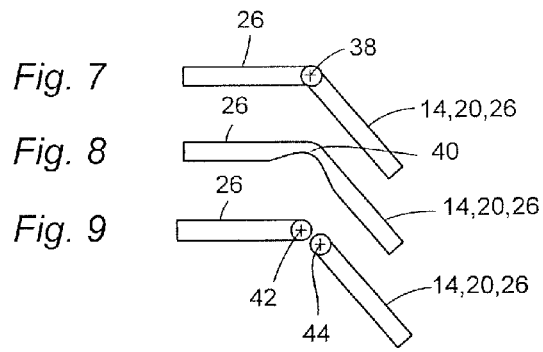
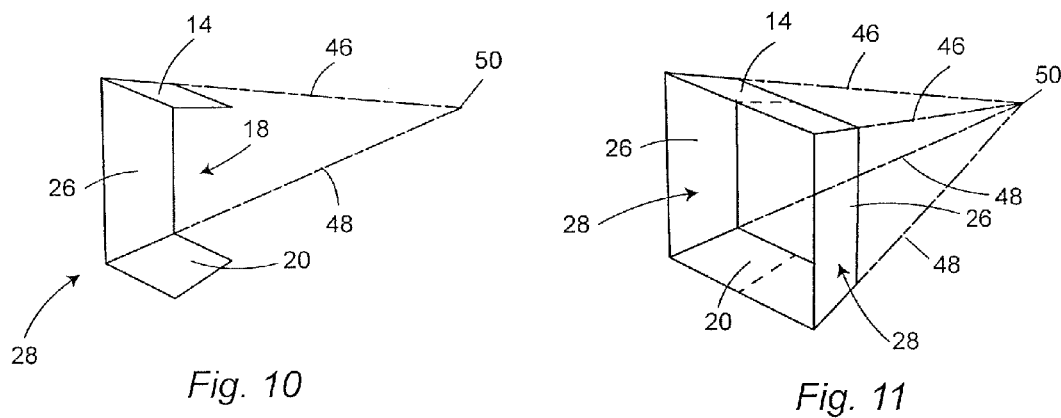
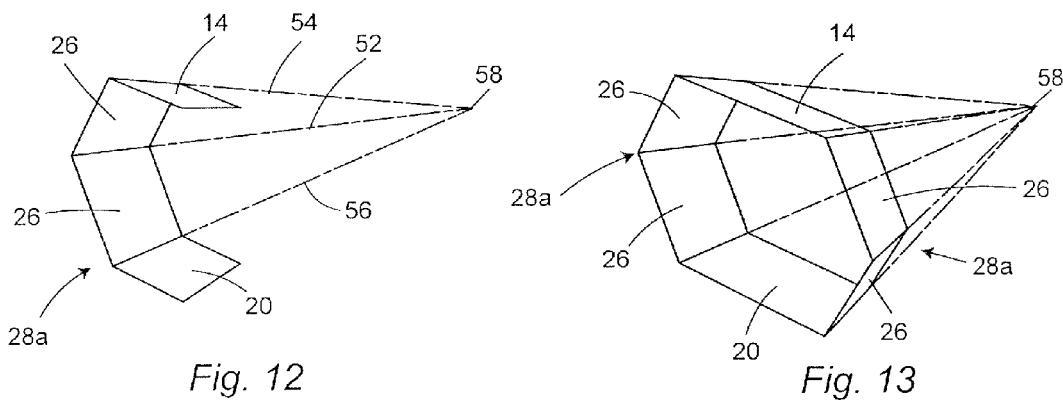

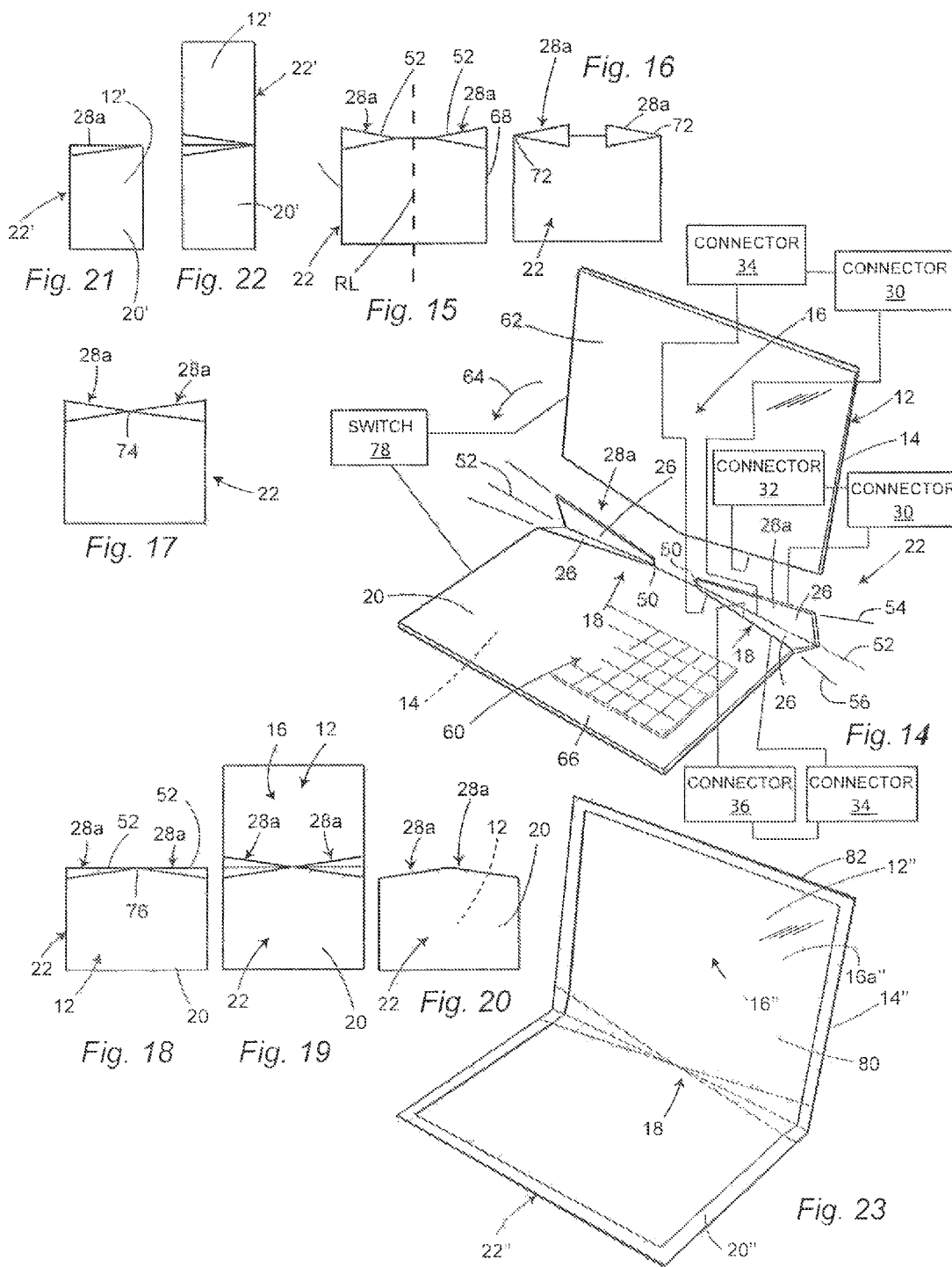

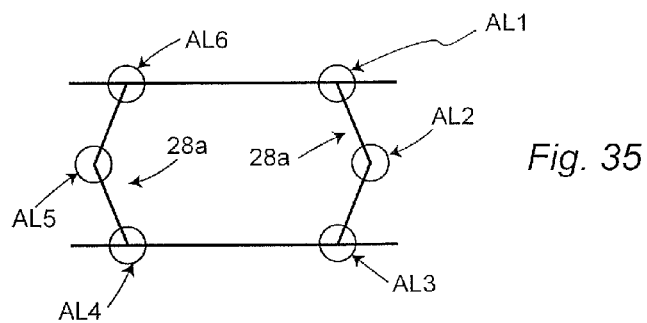
Fig. 35
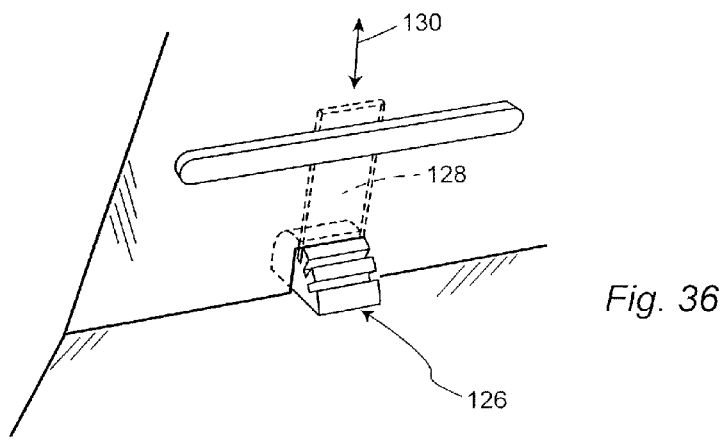
Fig. 36
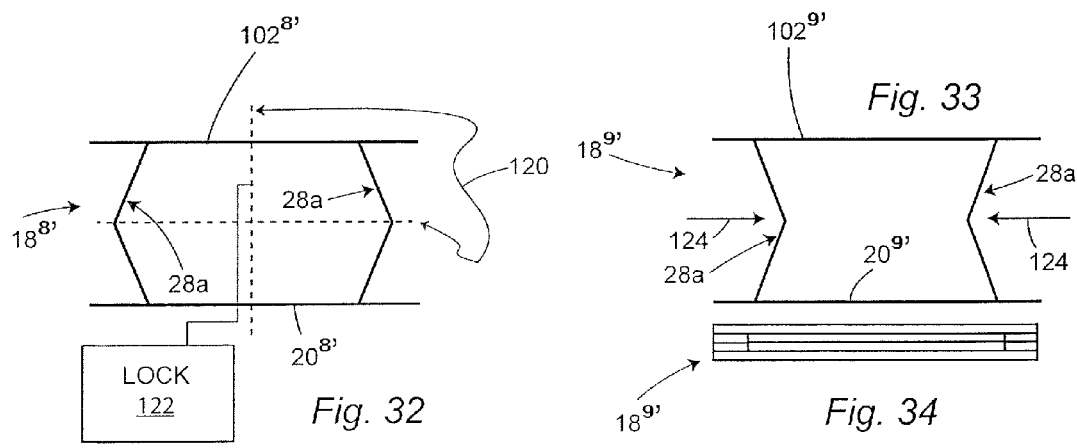
Fig. 33
Fig. 32
Fig. 34

MONITOR ASSEMBLY

BACKGROUND OF THE INVENTION

Field of the Invention

This invention relates to electronic devices with monitors having displays and, more particularly, to a support assembly that is part of, or usable with, an electronic device, to facilitate repositioning of a part of the electronic device on which a display area is located.

Background Art

Structures to support electronic monitors with displays have been available in different forms at least since the early 2000's when the cost of flat panel displays plummeted. Far lighter and thinner than traditional cathode ray tube (CRT) based televisions and video displays, flat panel liquid crystal displays (LCDs) can be as thin as 1 mm, offering larger screens, increased functionality, and greater mobility.

There has been a steady decline in shipment of desktop computers since 2010 and an uptick in tablets taking market away from laptops. By 2020, tablets and laptops are projected to make up 78% of sales, with desktops at 22%. This trend is accompanied by an increased need to make these displays more easily portable and usable in a variety of environments.

Comfort and safety are also considerations as it is common knowledge that working with the head and neck in an awkward position for a prolonged period causes the neck muscles to be unevenly burdened, thus causing neck and back pain and adding to fatigue. To achieve optimal comfort and safety, an ideal support for electronic displays positions the electronic screen at an appropriate height, distance, and angle in relationship to the viewer.

Displays come in many shapes and sizes. Supportive structures may be freestanding on a desk, portable/mobile, or fixed. They may consist of mechanisms to enable the user to rotate, raise, lower, and tilt the angle of viewing. Alternatively, displays may be fixed with clamps to a desk or wall mounted depending on the use of the display. As display sizes increase—for example, 27" plus 4K, HDR TVs, monitors and all-in-one PCs—new display attachment methods are desired. On the other end of the size spectrum, displays are designed for minimized weight and foldability for ease of mobility.

Electrophoretic, or electronic ink, a relatively newer display technology, is the optical component used in Electronic Paper Displays (EPD), as seen in Kindle™ readers. While the traditional LCD display needs to be refreshed 30 times per second, the EPD image is retained throughout viewing, even when power is turned off.

Paper-thin displays, one of the newest display technologies, are currently used in smartphones, smartwatches, other mobile devices, and televisions. Organic light-emitting diodes (OLEDs) or active matrix (AM) OLEDs, are available in rigid or flexible forms. Flexible OLEDs can be folded to incorporate a bending radius whereupon the display can be folded top-to-bottom like a clamshell to protect the screen and components.

Another paper-thin display, Quantum dots (QD), uses nanocrystals, 2 to 10 nanometers in diameter, to produce color. Like OLEDs, QDs can produce screen colors, eliminating the need for backlighting, and are flexible. Quantum dot displays currently require LED backlighting.

The industry continues to develop different mechanisms associated with all types of displays that allow the displays to be conveniently and optimally situated relative to a user, reoriented, and configured for safe storage and transportation.

SUMMARY OF THE INVENTION

In one form, the invention is directed to monitor assembly having an electronic monitor with a frame and a display area, and a support assembly configured to act between the monitor frame and a support for the electronic monitor with the support assembly in operative relationship with each of the monitor frame and the support for the electronic monitor. The support assembly has at least one link member configured to be movable: a) relative to the monitor frame around a first axis with the support assembly in the operative relationship with the monitor frame; and b) relative to a support for the electronic monitor around a second axis with the support assembly in the operative relationship with the electronic monitor support. The first and second axes are non-parallel to each other. With the support assembly in the operative relationship with each of the monitor frame and a support for the electronic monitor, the electronic monitor is guided in movement relative to the electronic monitor support around the first and second axes to thereby reposition the monitor display area relative to the support for the electronic monitor in which the support assembly is in the operative relationship with.

The monitor assembly may be provided in combination with a support for the electronic monitor.

In one form, the support assembly has a platform that is separate from the monitor frame and upon which the monitor frame is supported with the support assembly in the operative relationship with the monitor frame.

The platform, the support for the electronic monitor, and the at least one link member together make up a unitary assembly that can be placed upon a base and upon which the electronic monitor can be supported.

In one form, the at least one link member consists of first and second link members that define a first motion transmitting assembly. With the support assembly configured so that the first link member is movable relative to the monitor frame around the first axis, the second link member is movable relative to the support for the electronic monitor around the second axis, and the first and second link members are movable relative to each other around a third axis.

The first, second, and third axes may converge towards the same pivot location.

In one form, the support assembly includes a second motion transmitting assembly with two link members connected to each other, the monitor frame, and the support for relative movement around three separate axes.

The first, second, and third axes may converge towards a first pivot location. The three separate axes converge towards a second pivot location. The first and second pivot locations are at least approximately the same.

In an alternative form, the first and second pivot locations may be spaced from each other.

In one form, the support assembly includes a second motion transmitting assembly with two link members. The two link members are connected to each other, the monitor frame, and the support for relative movement around three separate axes. The first, second, and third axes and three separate axes converge in opposite directions.

The support for the electronic monitor may include a keyboard.

In one form, the support for the electronic monitor is in the form of a connector configured to attach to a base.

In one form, the platform, support for the electronic monitor, and at least one link member cooperatively extend continuously around a space.

In one form, the support assembly has a front and rear and laterally spaced sides. The support assembly is symmetrical on opposite sides of a plane extending in a fore-and-aft direction between the sides of the support assembly.

In one form, the support for the electronic monitor defines a surface to bear against a horizontally extending base surface. The platform defines a flat surface that is at an angle to the horizontally extending base surface with the support bearing against the horizontally extending base surface.

In one form, the support assembly is configured so that the monitor frame can be pivoted relative to the support for the electronic monitor around a single axis through a range of more than 180°.

In one form, the support assembly is configured so that the monitor frame can be repositioned relative to the support for the electronic monitor with an angular relationship between the monitor frame and support around the single axis maintained.

In one form, a locking mechanism is provided and is configured to act between at least two of the monitor frame, support for the electronic monitor, and at least one link member to selectively releasably maintain a desired relationship between the monitor frame and support for the electronic monitor.

A balancing mechanism may be provided and is configured to act between at least two of the monitor frame, support for the electronic monitor, and at least one link member to facilitate relative movement between the monitor frame and support for the electronic monitor.

The invention is also directed to the support assembly, as described above, by itself.

BRIEF DESCRIPTION OF THE DRAWINGS

FIGS. 7-9 show alternative forms of connectors between the link members, monitor frame, and support for the electronic monitor that allow relative movement therebetween around an axis;

FIG. 10 is a schematic representation of one form of motion transmitting assembly as shown in FIG. 5;

FIG. 11 is a view as in FIG. 10 showing a mirrored arrangement using two of the motion transmitting assemblies of FIG. 10;

FIG. 12 is a view as in FIG. 10 of an alternative form of motion transmitting assembly;

FIG. 13 is a schematic representation of a mirrored arrangement using two of the motion transmitting assemblies in FIG. 12;

FIG. 14 is an exploded, perspective view showing one specific form of monitor assembly, in the form of a laptop computer, with the inventive support assembly acting between a monitor and a support for the monitor and including one arrangement of motion transmitting assemblies;

FIG. 15 is a reduced, plan view of the electronic device as in FIG. 14 in a stored state with another arrangement of motion transmitting assemblies;

FIG. 16 is a view as in FIG. 17 with another arrangement of motion transmitting assemblies;

FIG. 17 is a view as in FIGS. 15 and 16 with still another arrangement of motion transmitting assemblies;

FIG. 18 is a view as in FIGS. 15-17 with yet another arrangement of motion transmitting assemblies;

FIG. 19 is a view as in FIG. 18 wherein the electronic monitor has been moved to an operating position;

FIG. 20 is a view as in FIG. 19 wherein the electronic monitor has been moved to under a housing/support;

FIGS. 21 and 22 correspond to FIGS. 18 and 19 with a different construction of electronic device and motion transmitting assembly;

FIG. 23 is a view as in FIG. 14 showing a modified form of electronic device with a monitor assembly according to the invention;

FIG. 32 is an elevation view of another form of monitorassembly, according to the invention;

FIG. 33 is a view as in FIG. 32 of a further modified form of monitor assembly;

FIG. 34 is a view as in FIG. 33 with the support assembly collapsed;

FIG. 35 is a schematic representation of a mirrored arrangement of motion transmitting assemblies; and FIG. 36 is a fragmentary, perspective view showing a locking mechanism for components that move relative to each other around an axis on a motion transmitting assembly.

DETAILED DESCRIPTION OF THE PREFERRED EMBODIMENT

Figure 1:
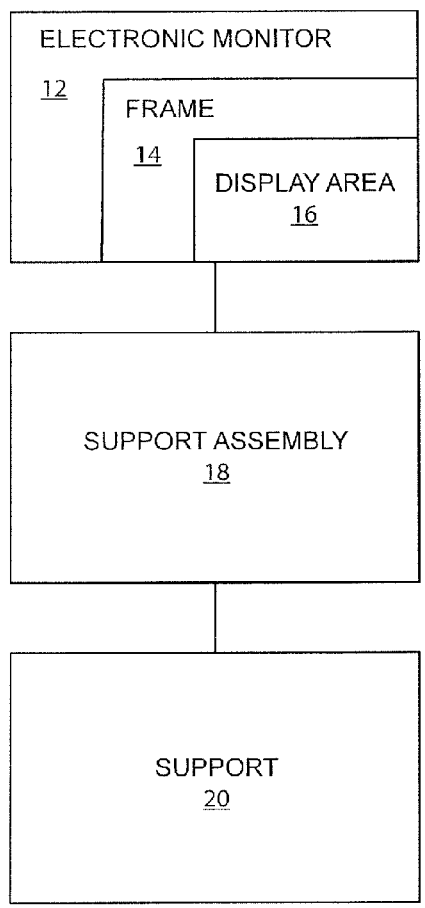
FIG. 1 is a schematic representation of one form of monitor assembly, according to the invention, including an electronic monitor and a support assembly that acts between the electronic monitor and a support for the electronic monitor.

The present invention is directed to a monitor assembly as shown schematically at 10 in FIG. 1. The monitor assembly consists of an electronic monitor 12 having a frame 14 on which there is a display area 16.

A support assembly 18 is configured to act between the monitor frame 14 and a support 20 for the electronic monitor 12 with the support assembly 18 in operative relationship with each of the monitor frame 14 and the support 20.

Figure 2:
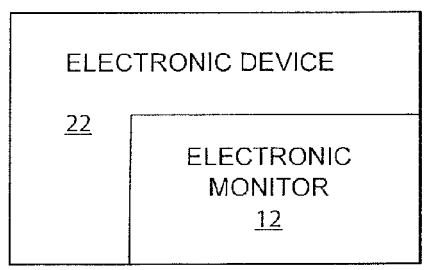
FIG. 2 is a schematic representation of an electronic device having an electronic monitor and with which the present invention can be utilized.
Figure 5:
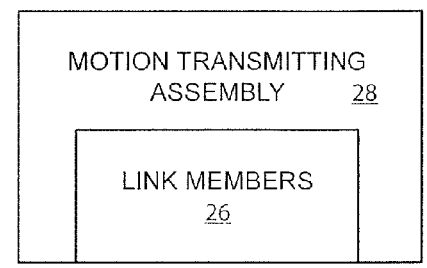
FIG. 5 is a schematic representation of a motion transmitting assembly in FIG. 1, including the link members in FIG. 4.

The electronic monitor 12 may be an independent unit or may be part of an electronic device, as shown schematically at 22 in FIG. 2, with other capabilities.

The schematic showings in FIGS. 1 and 2 are intended to encompass virtually an unlimited number of different electronic devices and components making up those devices. As just examples, the electronic device may be a computing device, a communication device, a cell phone, a tablet, a mobile device, a laptop computer, an input/output device, etc.

Figure 3:
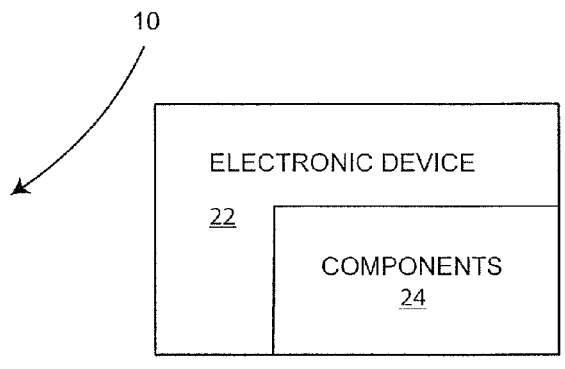
FIG. 3 is a schematic representation of an electronic device with operating components with which the present invention can be utilized.

The electronic device 22 can incorporate electronic components, typically in such devices and as shown schematically at 24 in FIG. 3. The components may be, for example, in addition to the electronic monitor 12, a protective case, a USB port(s), electronic port(s), rechargeable battery packs, sound cards, cameras, speakers, a communication pen, and other existing technologies.

The particular form of the electronic device 22 is not critical to the present invention, with the forms described hereinbelow being exemplary in nature only.

Figure 4:
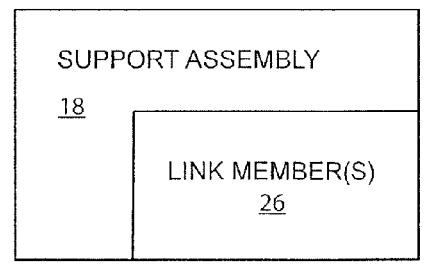
FIG. 4 is a schematic representation of a support assembly in FIG. 1 and showing additional detail, including link members.

The support assembly 18, in its generic form as seen in FIG. 4, consists of at least one link member 26 configured to be movable: a) relative to the monitor frame 14 around a first axis with the support assembly in an operative relationship with the monitor frame; and b) relative to the support 20 for the electronic monitor around a second axis with the support assembly 18 in an operative relationship with the support 20. The first and second axes are non-parallel to each other.

Within the generic disclosures in FIGS. 1-4, it is contemplated that a single link member 26 might be connected between the frame 14 and support 20. Alternatively, multiple link members 26 might be utilized such that the link members 26 may be connected to each other between the frame 14 and support 20 and/or other members.

The link members 26, individually or as connected to each other, may define motion transmitting assemblies 28 that make up part or all of the support assembly 18. One or more such motion transmitting assemblies 28 may be utilized to define the support assembly 18. Each motion transmitting assembly 28 functions as a "building block" that may be used by itself or interacted with other like or different building blocks or components to make up the support assembly 18.

Figure 6:
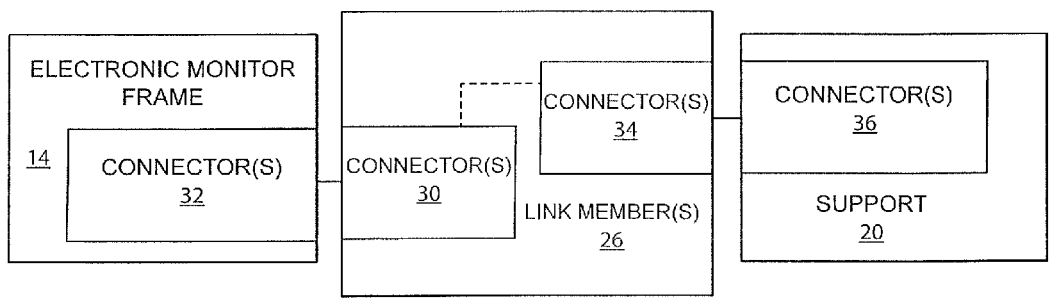
FIG. 6 is a schematic representation showing further details of the motion transmitting assembly of FIG. 5 acting between the electronic monitor frame and support for the electronic monitor.

As shown in FIG. 6, an exemplary motion transmitting assembly 28 includes at least one link member 26 acting between the electronic monitor frame 14 and support 20. At least one connector 30 on one of the link members 26 is configured to cooperate with at least one connector 32 on the electronic monitor frame 14. The connectors 30, 32 interact to guide movement between the link member 26 and electronic monitor frame 14 around a common axis, or adjacent axes which, for purposes of simplifying the explanation herein, will be considered to be a single axis.

The same or another link member 26 has at least one additional connector 34 that cooperates with at least one connector 36 on the support 20 to guide relative movement between the link member 26 and support 20 around a separate axis.

The link member connectors 30, 34 may interact with each other, when there is more than one link member acting between the electronic monitor frame 14 and support 20, to guide relative movement between the link members 26 around an additional axis.

At least two of the axes, and preferably all of the axes, in the motion transmitting assembly 28 are in non-parallel relationship to each other.

The schematic showing of the connectors 30, 32, 34, 36 in FIG. 6 is intended to encompass virtually an unlimited number of different configurations therefor. Exemplary connector structures, which are not intended to be limiting, are shown in FIGS. 7-9.

As shown in FIG. 7, a link member 26 is connected to the electronic monitor frame 14, support 20, or another link member 26 for pivoting movement around a fixed single axis 38.

FIG. 8 shows an alternative pivot connection wherein one link member 26 is connected to the electronic monitor frame 14, support 20, or another link member 26 through a live hinge arrangement so that the components are effectively moved relative to each other around an axis 40.

FIG. 9 shows an arrangement of connectors wherein a link member 26 and the associated monitor frame 14, support 20, or separate link member 26 are movable guidingly independently about adjacent axes 42, 44. The axes 42, 44 are in close enough proximity that they can be treated as a single axis for purposes of the description and claims herein.

Similarly, while the live hinge arrangement does not produce a precise pivot action around a single line, the components will be considered, for purposes of simplicity herein, to be movable relative to each other around a single axis.

Other configurations are contemplated, such as ball joints, etc.

The precise construction of the link members 26 is not critical to the present invention. Generally, each of the link members 26 will be described as having a substantially rigid construction between spaced locations whereat the connectors 30, 34 are located. In numerous of the examples hereinbelow, the link members 26 are shown as generally flat panels with a generally polygonal peripheral shape. This is not a requirement. As but one example, as described further below, the panels may be substantially rigid but curved between their respective axes.

In FIG. 10, one motion transmitting assembly 28 is shown as a basic "building block" that is usable alone, or with a like motion transmitting assembly, and/or with other structure. The motion transmitting assembly 28 has a link member 26 joined to a monitor frame 14 and support 20 through appropriate connectors (details not shown but shown generically in FIG. 6) so that the link member 26 pivots relative to the monitor frame 14 around an axis 46, with the link member 18 and support 20 movable relative to each other around a separate axis 48. The axes 46, 48 converge to, or towards, a pivot location 50. With this arrangement, a single link member 26 defines the support assembly 18, shown schematically in FIG. 1.

In FIG. 11, a mirrored arrangement of the motion transmitting assembly 28, as shown in FIG. 10, is depicted with all axes 46, 48 converging towards the same pivot location 50. This convergence of all axes to/towards a single location is not required.

In FIG. 12, a three axis motion transmitting assembly is shown at 28a with link members 26 connected to each other for pivoting movement around an axis 52. The link member 26 connected to the monitor frame 14 is connected thereto for relative movement around an axis 54. The other link member 26 is connected to the support 20 for relative movement around an axis 56. All axes converge to a pivot location 58.

FIG. 13 shows a mirrored arrangement of the motion transmitting assembly 28a with pivot axes between connected link members 26, the monitor frame 14, and support 20 converging to or towards the pivot location 58.

The motion transmitting assemblies 28, 28a are but representative structures used to make up the support assembly 18. Each motion transmitting assembly/building block 28 can be connected or duplicated by mirroring, rotating, patterning, offsetting, sharing axes, sharing linkages, etc. Different basic motion transmitting assemblies/building blocks 28 can be used, either alone or in combination with other components or motion transmitting assemblies.

In the basic motion transmitting assemblies 28, 28a, the pivot axes are characterized as converging to or towards a single point. The axes on the different motion transmitting assemblies 28 could converge at different locations with a particular design dictated by the relative movement desired between the monitor frame 14 and support 20.

In FIG. 14, one exemplary form of electronic device 22 is shown in the form of a laptop computer with the support 20 in the form of a housing to which a monitor frame 14 is mounted. The support/housing 20 contains operating components and supports a keyboard 60. The monitor frame 14 defines the display area 16.

The support assembly 18 acts between the monitor frame 14 and support/housing 20 to allow the support/housing 20 and monitor frame 14 to be moved selectively between an operative state, as shown in FIG. 14 in solid lines, and a stored state, shown partially in dotted lines, wherein the front surface 62 of the monitor frame 14 is pivoted forwardly in the direction of the arrow 64 from the solid line position to overly an upwardly facing surface 66 on the support/housing 20.

The support assembly 18 consists of two of the motion transmitting assemblies 28a at laterally spaced locations. The motion transmitting assemblies 28a are connected in the same manner to the monitor frame 14 and support/housing 20.

As in the generic showing in FIG. 6, the link member 26 connected to the support/housing 20 has a connector 34 that cooperates with a connector 36 on the support/housing 20 to guide relative pivoting movement about the axis 56. Connectors 30, 34 cooperate between the link members 26 to guide relative movement around the axis 52. Connectors 30, 32 cooperate to guide relative movement between the link member 26 and the monitor frame 14 around the axis 54.

The connectors 30, 32, 34, 36 may be configured so that the motion transmitting assemblies 28a are permanently connected to the monitor frame 14 and/or support/housing 20. Alternatively, a separable connection can be effected. There is no limitation as to how the motion transmitting assemblies 28a, making up the support assembly 18, connect to the monitor frame 14 and support/housing 20 so long as the described relative movement between the components is made possible. For example, a snap connection might be effected. An engageable lip might be provided to make the connection. Permanent or reattachable adhesive might be employed. Other non-slip materials are contemplated. Velcro -type materials might be utilized. The parts may be snapped together, trapped in an assembled relationship, held by magnets, etc.

The FIG. 14 configuration for the support assembly 18 allows the plane of the front surface 62, at which the display area 16 is defined, to be moved substantially about a single axis as the monitor frame 14 and support/housing 20 are changed between the operative and stored states.

The support assembly 18 allows additional degrees of freedom whereby the plane of the front surface 62 can be selectively repositioned relative to the support/housing 20, such as by being tilted angularly towards each side while allowing front-to-rear pivoting.

In this embodiment, the pivot locations 50 for the separate motion transmitting assemblies 28a are spaced from each other, which confines rearward pivoting.

With the support assembly 18 in operative relationship with each of the monitor frame 14 and support/housing 20, the electronic monitor 12, including the monitor frame 14 and display area 16 thereon, is guided in movement relative to the support/housing 20 around each of the axes about which the link members 26 move relative to each other and the monitor frame 14 and support/housing 20 to thereby reposition the monitor display area 16 in a number of different manners while maintaining the support housing 20 stationary.

The axes 52 on the motion transmitting assemblies 28 may be co-linear. Alternatively, as shown in FIG. 15, the motion transmitting assemblies 28a may be constructed so that the axes 52 are not co-linear. This affords different movement capabilities.

FIG. 15 shows the electronic device 22 with the components in a stored state. The construction of the motion transmitting assemblies 28a is such that they are symmetrical about a fore-and-aft reference line RL midway between the sides 68, 70 of the electronic device 22, to product a mirrored arrangement for the motion transmitting assemblies 28a, as in many of the embodiments described hereinbelow.

In FIG. 16 a variation is shown wherein motion transmitting assemblies 28a on the electronic device 22 have axes that converge oppositely towards pivot locations 72 that are at the sides of the electronic device 22.

FIG. 17 shows the electronic device 22 with the motion transmitting assemblies 28a as in FIG. 15 wherein the pivot location 74 for each motion transmitting assembly 28a is the same.

FIGS. 18-20 show the electronic device 22 with motion transmitting assemblies 28a having a common pivot location 76 for their axes and wherein the axes 52 are co-linear.

With this arrangement, starting with the electronic monitor 12 and support/housing 20 in the stored state of FIG. 18, the electronic monitor 12 can be pivoted upwardly around the line of the axes 52 and fully over center wherein the electronic monitor 12 underlies the support/housing 20, as shown in FIG. 20.

At the same time, angular adjustment between the monitor 12 and support/housing 20 can be effected, to include side-to-side, front-to-rear, vertical, etc. movement.

With the basic functions of the motion transmitting assemblies 28 understood, different motion transmitting arrangements can be readily devised to allow the desired movement between the electronic monitors and supports therefor.

In FIGS. 21 and 22, a modified form of electronic device 22' has an electronic monitor 12' connected to a support/housing 20' through a single motion transmitting assembly 28a. As with all embodiments, as shown generically in FIG. 14, relative movement between the electronic monitor 12 and the support/housing 20 may cause operation of a switch 78 that triggers a particular function for the electronic device 22'.

The electronic monitor 12 and/or the support/housing 20 could attach to or incorporate a physical keyboard or a display, touch display, LCD, OLED, transparent OLED, foldable/flexible OLED, a single foldable/flexible OLED continuously spanning between the electronic monitor 12 and the support/housing 20.

The frame 14 may be any structure that supports a display component to be viewed on at least one side by a user. As shown in FIG. 23, a frame 14" on the electronic device 22 supports a flexible/bendable OLED component 80 that may be on the monitor 12" alone or on the monitor 12" and the support/housing 20". The "frame" may be simply a backing layer, on edge, or some other structure through which the component 80 is mounted. A support assembly 18, as shown in Figs, 18-20, is utilized.

It is possible that, in addition to having the display area 16" at the front of the electronic monitor 12", a display area 16a" may also be provided on the back side 82 of the electronic monitor 12".

The component 80 may be integrally formed with the monitor frame 14" and/or support/housing 20" or a component separately attached thereto so as to be removable as for storage.

Figure 24:
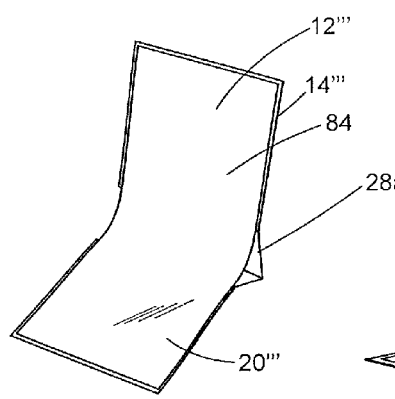
FIG. 24 is a view as in FIG. 23 of a further modified form of electronic device with the inventive monitor assembly incorporated.
Figure 25:
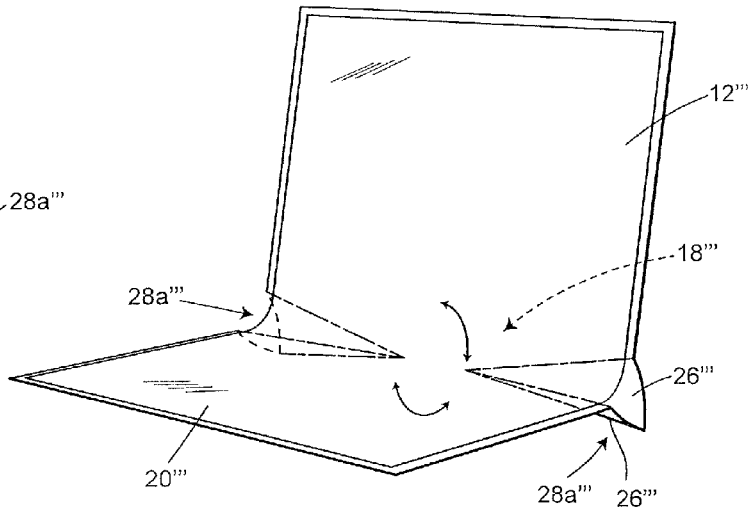
FIG. 25 is an enlarged view of the electronic device in FIG. 24 from a different perspective.
Figure 26:
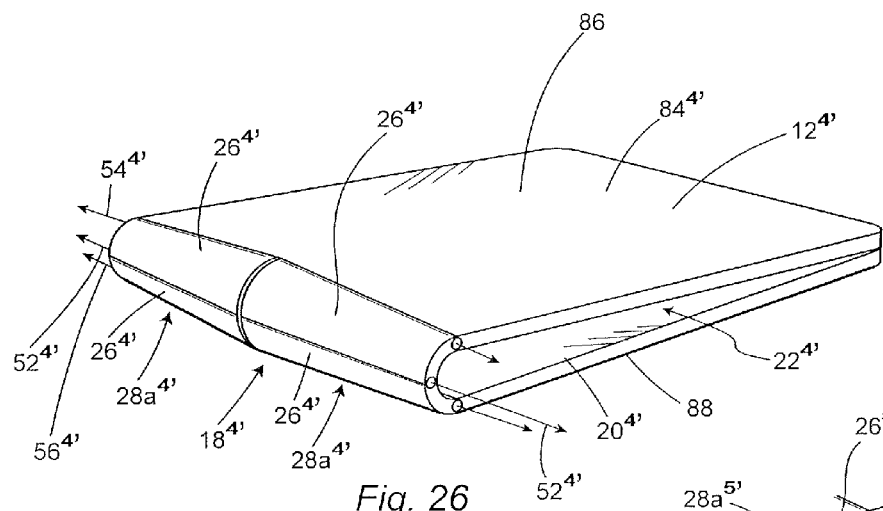
FIG. 26 is a perspective view of a modified form of the electronic device in FIG. 25 in a folded state.

FIGS. 24-26 show a further refinement of this last concept wherein the flexible/foldable OLED component 84 essentially itself defines the corresponding monitor 12''', including the frame 14''' and support/housing 20'''.

The electronic monitor 12''' is considered to have a frame 14''' which may be nothing more than a backing layer, an edging, etc., that may lack the rigidity of a conventional monitor frame as shown in FIG. 14.

In this embodiment, the motion transmitting assemblies 28a''' that make up the support assembly 18''' have the same general configuration as corresponding components in the electronic device 22 shown in FIG. 14. The link members 26''', 28''' are shown to be curved or recessed to accommodate/streamline the folded clamshell shape of the electronic device 22''' wherein the monitor 12''' and support/housing 20''' are folded against each other to a stored state, corresponding to that shown for the modified electronic device $22^{4'}$ in FIG. 26.

The electronic device $22^{4'}$ has an electronic monitor $12^{4'}$ and a support/housing $20^{4'}$. The support assembly $18^{4'}$ consists of motion transmitting assemblies $28a^{4'}$ with curved link members $26^{4'}$ with axes $52^{4'}$, $54^{4'}$, $56^{4'}$ that converge laterally away from each other.

As can be seen, the curved configuration of the link members $26^{4'}$ creates a smooth, continuous transition between the exposed surfaces 86, 88 on the electronic monitor $12^{4'}$ and support/housing $20^{4'}$, respectively, with those components in their stored state and the component $84^{4'}$ folded to the FIG. 26 configuration.

Figure 27:
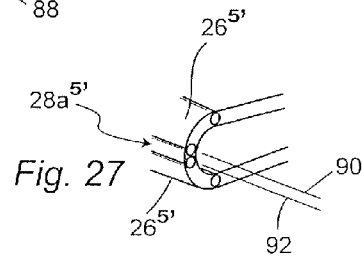
FIG. 27 is a fragmentary, perspective view of a motion transmitting assembly that is modified from that shown in FIG. 26.

FIG. 27 shows a slight modification of the motion transmitting assembly $28a^{5'}$ wherein rather than having a single axis $52^{4'}$, parallel pivot axes 90, 92 are provided where the link members $26^{5'}$ pivot relative to each other.

Figure 28:
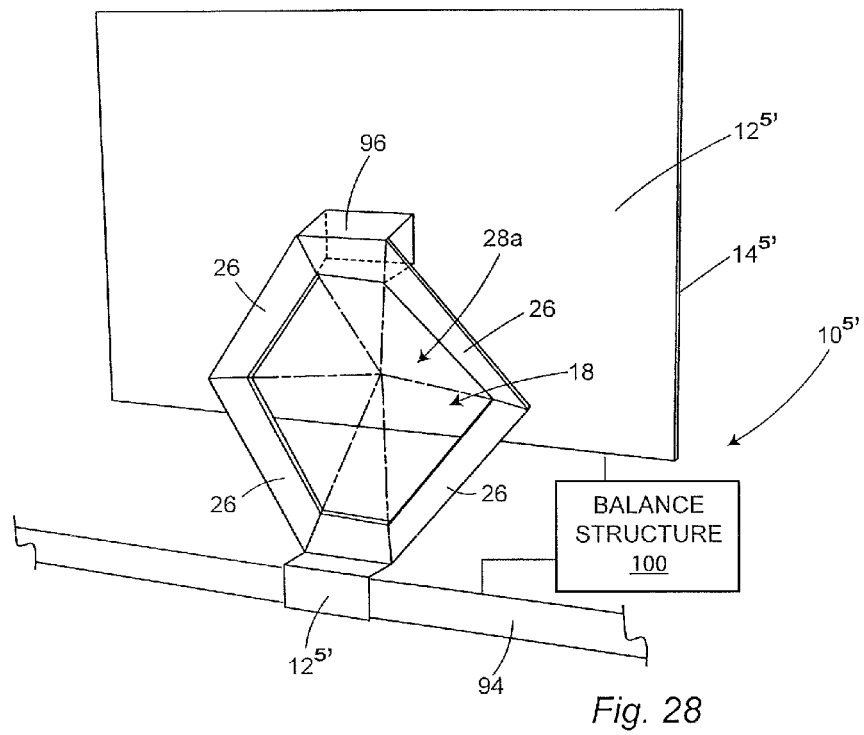
FIG. 28 is a rear perspective view of another form of monitor assembly, according to the invention, and including a dedicated electronic monitor supported from an independent base.

FIG. 28 depicts a modified form of monitor assembly $10^{5'}$ wherein a conventional, dedicated, electronic monitor $12^{5'}$ is supported from a base 94.

In this embodiment, the support/housing $20^{5'}$ is in the form of a connector configured to attach, permanently or releasably, to the base 94.

The motion transmitting assembly 28a defines the support assembly 18 between the connector/support/housing $20^{5'}$ and the monitor $12^{5'}$.

The monitor $12^{5'}$ may have an appropriate fitting 96 to connect to the motion transmitting assembly 28a.

Figure 29:
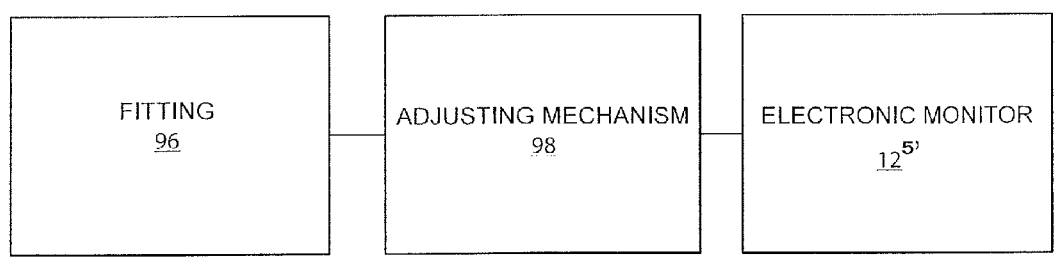
FIG. 29 is a schematic representation of an adjusting mechanism for assisting monitor movement in FIG. 28.

In another form, as shown in FIG. 29, an adjusting mechanism 98 can be provided between the fitting 96 and the rest of the monitor $12^{5'}$. This may allow an additional degree of angular adjustment and distance adjustment to better facilitate convenient and comfortable user viewing.

An optional balancing structure 100 can be provided to act between the base 94 and the electronic monitor $12^{5'}$ to counterbalance the weight of the monitor $12^{5'}$ to facilitate its reorientation. The balancing structure may incorporate one or more springs, or other structure, to accomplish this function.

While the support/housing $20^{5'}$ is shown as a clamp arrangement, it could have another form, such as a freestanding base, a wall mounted structure such as a clamp, suction cup, adhesive, Velcro®-type adhesive, etc.

While the monitor $12^{5'}$ is described above as a dedicated monitor, the frame $14^{5'}$ could incorporate any other capabilities, such as to make the structure within the frame $14^{5'}$ a fully functional personal computer.

Figure 30:
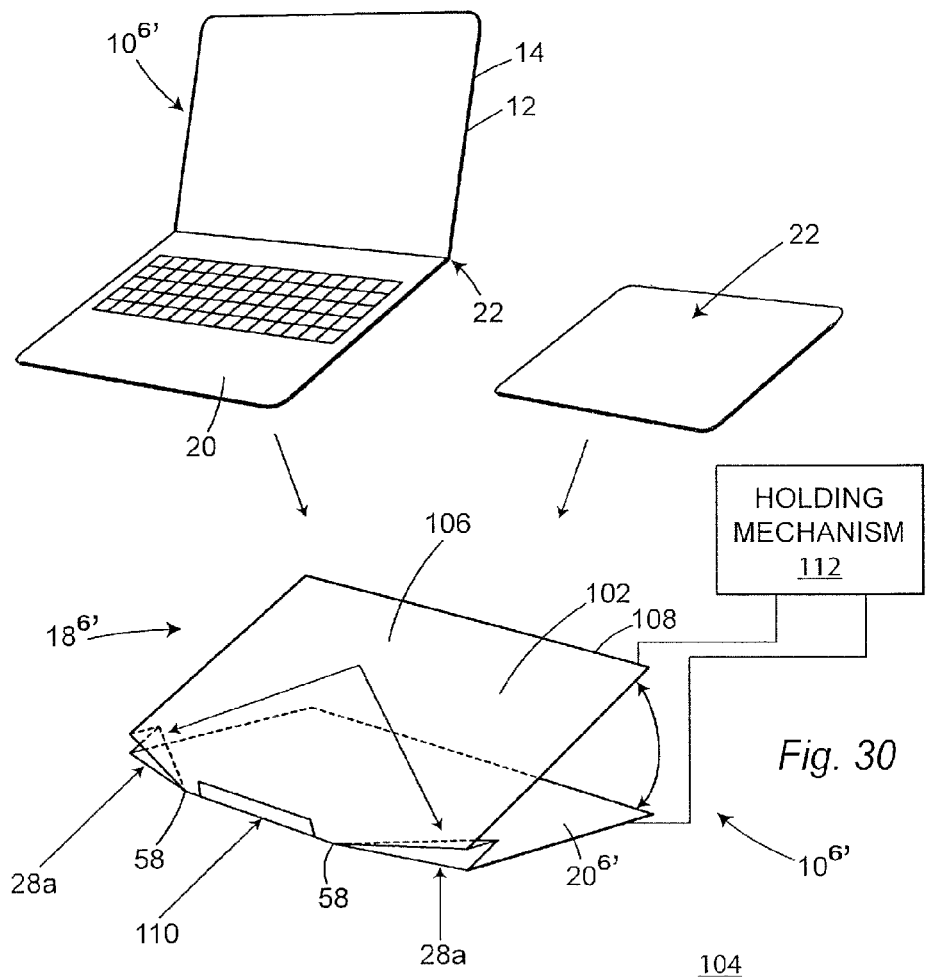
FIG. 30 is an exploded, perspective view of another form of the inventive monitor assembly that is separate from an electronic device.

FIG. 30 shows another form of monitor assembly $10^{6'}$ wherein the support assembly $18^{6'}$ includes a platform 102 that is separate from the electronic monitor 12 and a frame 14 thereon.

In this embodiment, the platform 102, motion transmitting assemblies 28a, and a support $20^{6'}$ together make up a unitary assembly that can be placed upon a base 104. The entire electronic device 22, including the electronic monitor 12 and housing 20, are supported on the unitary assembly.

In this embodiment, the motion transmitting assemblies 28a act between the platform 102 and base $20^{6'}$ to define the support assembly $18^{6'}$.

The electronic device 22, as described above, is a conventional laptop computer that has an operative state, shown on the left side of FIG. 30, and a stored/folded state, shown on the right side of FIG. 30. In either state, the housing 20 can be rested against an upwardly facing surface 106 on the platform 102. It is desired that the platform 102 be movable by tipping the back end 108 upwardly relative to the support $20^{6'}$, as permitted by the motion transmitting assemblies 28a, that have axes converging towards each other and to/towards spaced pivot locations 58.

An upstanding lip 110 blocks forward sliding of the electronic device 20 past a desired operative position therefor on the platform 102.

An adjustable holding mechanism 112 acts, as between the platform 102 and support $20^{6'}$, to releasably maintain the platform 102 in potentially a number of different desirable angular positions.

The motion transmitting assemblies 28a permit a wide range of different angular adjustments in addition to the basic pivoting described above.

It is possible to construct the support assembly $18^{6'}$ so that it can be conveniently collapsed by moving the platform 102 facially against the support $20^{6'}$. The electronic device 22 in its stored state can in turn be placed against the lowered platform 106 to provide a compact arrangement of components that can be readily transported and potentially placed in a low profile container for transportation.

To maintain the electronic device 22 in a desired position on the platform 102 for both use and transportation, in addition to, or instead of, the lip 110, other means can be used. For example, adhesive, that may be reattachable, may be used. A high friction material may be applied to the platform surface 106. Velcro®-type material might be utilized. Snaps, a trapping arrangement, magnetic components, etc. might also be utilized for this purpose.

The electronic device 22, while shown as a personal computer, can be any type of electronic device, such as a tablet, iPad, mobile device, etc.

Figure 31:
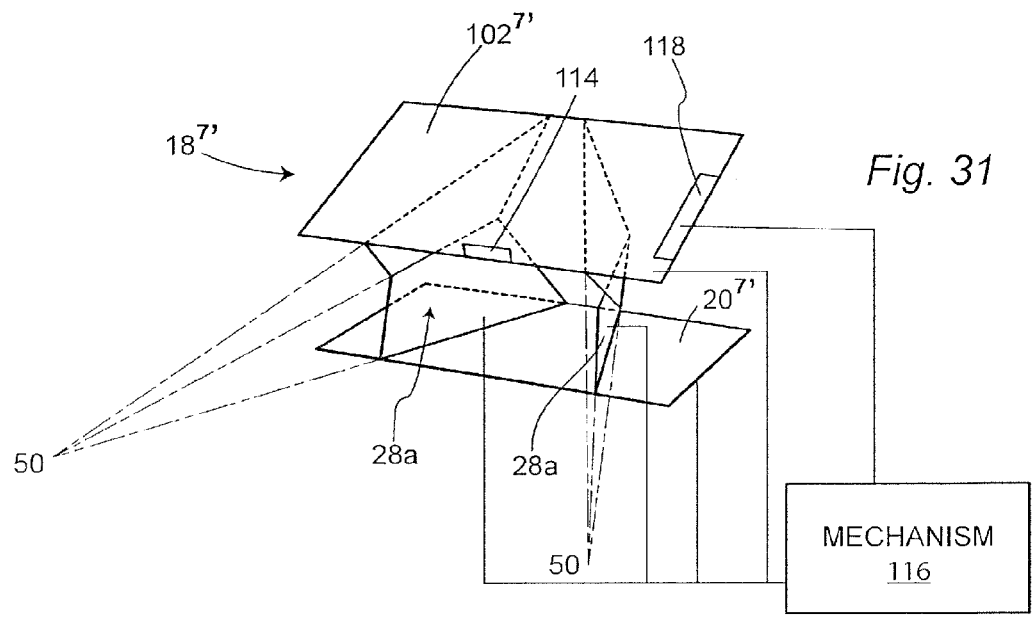
FIG. 31 is a perspective view of a monitor assembly as in FIG. 30 in a modified form.

A modified form of the support assembly $18^{6'}$ is shown at $18^{7'}$ in FIG. 31. In FIG. 31, a mirrored arrangement of motion transmitting assemblies 28a is utilized between a platform $102^{7'}$ and a support $20^{7'}$. In this embodiment, the axes converge to two separate pivot locations at the front of the support assembly $18^{7'}$, whereas in FIG. 30, the corresponding axes converge laterally inward towards each other. A retaining lip 114 is provided at the front of the platform $102^{7'}$ which is angled as the platform 102 is as shown in FIG. 30.

The support assembly $18^{7'}$ is otherwise usable in the same basic manner as described for the support assembly $18^{6'}$.

Additionally, as shown schematically in FIG. 31, a mechanism 116 may be provided that acts between the platform $102^{7'}$, support $20^{7'}$, and motion transmitting assemblies 28a to facilitate relative movement and potentially locking between these components.

A lever 118 may be used to control the mechanism 116, as to effect engagement and/or release of a lock, etc.

FIG. 32 shows a further modified form of support assembly $18^{8'}$, similar to that shown at $18^{6'}$ in FIG. 30. A mirrored arrangement of motion transmitting assemblies 28a is provided between a platform $102^{8'}$ and a support $20^{8'}$.

With the arrangement as depicted, the platform $102^{8'}$ can be controllably moved at least upwardly and downwardly relative to the support $20^{8'}$ for height adjustment of the platform $102^{8'}$. At least one component 120, as shown schematically in FIG. 32, can be used to change and/or maintain the height of the platform $102^{8'}$. The component 120 may be in the form of a Bowden cable, a cylindrical rod, rack, etc. A lock 122, as in the form of a collar, may travel/slide along the component 120 to allow height selection.

FIGS. 33 and 34 show another form of support assembly $18^{9'}$ which differs from the support assembly $18^{8'}$ primarily by reason of the orientation of the motion transmitting assemblies 28a that collapse inwardly towards each other, as indicated by the arrows 124 to lower a platform $102^{9'}$ relative to a base $20^{9'}$.

The platform $102^{9'}$ can be collapsed downwardly against the support $20^{9'}$ to a compact collapsed state, as shown in FIG. 34, when the system is not being used.

The support assemblies $18^{8'}$, $18^{9'}$ are configured so that the platforms $102^{8'}$, $102^{9'}$, supports $20^{8'}$, $20^{9'}$ and components of the motion transmitting assemblies cooperatively extend continuously about a space.

The support assemblies $18^{8'}$, $18^{9'}$ can be constructed so that the motion transmitting assemblies 28a assume an over center state wherein the platforms $102^{8'}$, $102^{9'}$ are blocked at a certain position.

FIG. 35 schematically depicts a mirrored arrangement of motion transmitting assemblies 28a wherein all pivot axes locations AL1, AL2, AL3, AL4, AL5, AL6 are circled.

FIG. 36 depicts one possible locking mechanism located at any one of the axis locations (AL1-AL6). A gear-type component 126 is fixed to one of the link members 26, the frame 14, or support 20 and cooperates with a translating pin 128 on the cooperating and relatively moving link member 26, frame 14, or support 20. The pin 128 is translatable in the line indicated with the double-headed arrow 130 to selectively engage and disengage the toothed component 126 to allow releasable fixing of different angular relationships.

This or any other type of locking mechanism might be incorporated to fix the link members 26, the frame 14, and support 20 in a desired angular/height relationship. Any of the angles between these components might be releasably locked to accomplish this end.

Rubber bushings may be provided at the pivot connection location to damp vibrations, etc.

The locking mechanism could incorporate gears, levers, or linkages, Bowden cables with a lever, a kickstand, ratchets, sliding connecting rods, toothed members, etc.

The foregoing disclosure of specific embodiments is intended to be illustrative of the broad concepts comprehended by the invention.

The invention claimed is:

1. A monitor assembly comprising:
   an electronic monitor having a frame and a display area; and
   a support assembly configured to act between the monitor frame and a support for the electronic monitor with the support assembly in operative relationship with each of the monitor frame and the support for the electronic monitor,
   the support assembly comprising at least one link member configured to be movable: a) relative to the monitor frame around a first axis with the support assembly in the operative relationship with the monitor frame; and b) relative to a support for the electronic monitor around a second axis with the support assembly in the operative relationship with the electronic monitor support,
   the first and second axes non-parallel to each other,
   whereby with the support assembly in the operative relationship with each of the monitor frame and a support for the electronic monitor, the electronic monitor is guided in movement relative to the electronic monitor support around the first and second axes to thereby reposition the monitor display area relative to the support for the electronic monitor in which the support assembly is in the operative relationship with.

2. The monitor assembly according to claim 1 in combination with the support for the electronic monitor.

3. The combination according to claim 2 wherein the support assembly comprises a platform that is separate from the monitor frame and upon which the monitor frame is supported with the support assembly in the operative relationship with the monitor frame.

4. The combination according to claim 3 wherein the platform, the support for the electronic monitor, and the at least one link member together make up a unitary assembly that can be placed upon a base and upon which the electronic monitor can be supported.

5. The combination according to claim 2 wherein the at least one link member comprises first and second link members that define a first motion transmitting assembly, wherein the support assembly is configured so that the first link member is movable relative to the monitor frame around the first axis, the second link member is movable relative to the support for the electronic monitor around the second axis, and the first and second link members are movable relative to each other around a third axis.

6. The combination according to claim 5 wherein the first, second, and third axes converge towards a same pivot location.

7. The combination according to claim 5 wherein the support assembly comprises a second motion transmitting assembly comprising two link members with the two link members connected to each other, the monitor frame, and the support for relative movement around three separate axes.

8. The combination according to claim 7 wherein the first, second, and third axes converge towards a first pivot location, the three separate axes converge towards a second pivot location, and the first and second pivot locations are at least approximately the same.

9. The combination according to claim 7 wherein the first, second, and third axes converge towards a first pivot location, the three separate axes converge towards a second pivot location, and the first and second pivot locations are spaced from each other.

10. The combination according to claim 5 wherein the support assembly comprises a second motion transmitting assembly comprising two link members with the two link members connected to each other, the monitor frame, and the support for relative movement around three separate axes, and the first, second, and third axes and three separate axes converge in opposite directions.

11. The combination according to claim 2 wherein the support for the electronic monitor includes a keyboard.

12. The combination according to claim 2 wherein the support for the electronic monitor comprises a connector configured to attach to a base.

13. The combination according to claim 3 wherein the platform, support for the electronic monitor, and at least one link member cooperatively extend continuously around a space.

14. The combination according to claim 2 wherein the support assembly has a front and rear and laterally spaced sides and the support assembly is symmetrical on opposite sides of a plane extending in a fore-and-aft direction between the sides of the support assembly.

15. The combination according to claim 3 wherein the support for the electronic monitor defines a surface to bear against a horizontally extending base surface and the platform defines a flat surface that is at an angle to the horizontally extending base surface with the support bearing against the horizontally extending base surface.

16. The combination according to claim 2 wherein the support assembly is configured so that the monitor frame can be pivoted relative to the support for the electronic monitor around a single axis through a range of more than 180°.

17. The combination according to claim 16 wherein the support assembly is configured so that the monitor frame can be repositioned relative to the support for the electronic monitor with an angular relationship between the monitor frame and support around the single axis maintained.

18. The combination according to claim 2 further including a locking mechanism configured to act between at least two of the monitor frame, support for the electronic monitor, and at least one link member to selectively releasably maintain a desired relationship between the monitor frame and support for the electronic monitor.

19. The combination according to claim 2 further including a balancing mechanism configured to act between at least two of the monitor frame, support for the electronic monitor, and at least one link member to facilitate relative movement between the monitor frame and support for the electronic monitor.

20. A support assembly for an electronic monitor as recited in claim 1 and configured to cooperate with an electronic monitor as recited in claim 1.

* * * * *